US012796574B2

(12) United States Patent
Kim et al.

(10) Patent No.: US 12,796,574 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Youngbae Kim, Suwon-si (KR); Seoeun Kyung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 18/345,955

(22) Filed: Jun. 30, 2023

(65) Prior Publication Data

US 2024/0006282 A1 Jan. 4, 2024

(30) Foreign Application Priority Data

Jul. 4, 2022 (KR) ........................ 10-2022-0081624

(51) Int. Cl.
*H10W 90/00* (2026.01)
*H10W 70/65* (2026.01)
(Continued)

(52) U.S. Cl.
CPC ......... *H10W 90/701* (2026.01); *H10W 70/65* (2026.01); *H10W 70/685* (2026.01);
(Continued)

(58) Field of Classification Search
CPC ............... H10W 70/614; H10W 70/65; H10W 70/685; H10W 74/111; H10W 76/12; H10W 90/701; H10W 90/794
See application file for complete search history.

(56) References Cited

U.S. PATENT DOCUMENTS 8,269,348 B2 9/2012 Fazelpour
9,502,391 B2 11/2016 Kwon et al.
(Continued)

FOREIGN PATENT DOCUMENTS

KR 10-2019-0006430 1/2019
KR 10-2019-0049247 A 5/2019
(Continued)

OTHER PUBLICATIONS

Office Action in Korean Appln. No. 10-2022-0081624, mailed on Nov. 25, 2025, 25 pages (with English translation).
(Continued)

*Primary Examiner* — Telly D Green
(74) *Attorney, Agent, or Firm* — Fish & Richardson P.C.

(57) ABSTRACT

A semiconductor package includes: a redistribution structure having a first surface and a second surface and including a plurality of redistribution layers, the plurality of redistribution layers including first and second redistribution layers adjacent to the first and second surfaces, respectively; a semiconductor chip disposed on the first surface; a frame including a wiring structure connected to a first redistribution via of the first redistribution layer; and UBM layers disposed on the second surface and having a plurality of UBM vias. The UBM layers may include at least one UBM layer overlapping the first redistribution via, and the first redistribution via may be disposed so as not to overlap a plurality of UBM vias of the at least one UBM layer and to overlap an internal region closer to a central point of the at least one UBM layer than the plurality of UBM vias.

20 Claims, 11 Drawing Sheets

II-II'

'B1'

(51) Int. Cl.

| | |
|---|---|
| ***H10W 70/685*** | (2026.01) |
| ***H10W 74/10*** | (2026.01) |
| ***H10W 76/12*** | (2026.01) |

(52) U.S. Cl.

CPC .......... *H10W 74/111* (2026.01); *H10W 76/12* (2026.01); *H10W 90/794* (2026.01)

(56) References Cited

U.S. PATENT DOCUMENTS

| | | | | |
|---|---|---|---|---|
| 10,714,440 | B2 | 7/2020 | Kim et al. | |
| 10,756,040 | B2 | 8/2020 | Yu et al. | |
| 10,818,621 | B2 | 10/2020 | Lee et al. | |
| 10,861,784 | B2 | 12/2020 | Kim et al. | |
| 11,581,284 | B2 * | 2/2023 | Kang .................... | H10W 72/20 |
| 2019/0131221 | A1 | 5/2019 | Lee et al. | |
| 2019/0189579 | A1 | 6/2019 | Kim et al. | |
| 2020/0118959 | A1 | 4/2020 | Kim et al. | |
| 2020/0235058 | A1 | 7/2020 | Park et al. | |
| 2021/0257305 | A1 * | 8/2021 | Yim .................... | H10W 70/614 |
| 2021/0288000 | A1 | 9/2021 | Heo | |
| 2021/0375833 | A1 | 12/2021 | Lee et al. | |
| 2022/0052006 | A1 * | 2/2022 | Kang .................... | H10W 72/20 |
| 2023/0187399 | A1 * | 6/2023 | Kang .................... | H10W 72/20<br>257/737 |

FOREIGN PATENT DOCUMENTS

| | | | |
|---|---|---|---|
| KR | 10-2019-0073973 | A | 6/2019 |
| KR | 10-2020-0000096 | A | 1/2020 |
| KR | 10-2020-0058055 | A | 5/2020 |
| KR | 10-2021-0131477 | A | 11/2021 |

OTHER PUBLICATIONS

Extended European Search Report in European Appln. No. 23183029.0, mailed on Dec. 7, 2023, 8 pages.

* cited by examiner

'B1'

100A

'A2'

'B2'

SEMICONDUCTOR PACKAGE

CROSS-REFERENCE TO RELATED APPLICATION(S)

This application claims benefit of priority to Korean Patent Application No. 10-2022-0081624 filed on Jul. 4, 2022, in the Korean Intellectual Property Office, the disclosure of which is incorporated herein by reference in its entirety.

TECHNICAL FIELD

The present disclosure relates to a semiconductor package.

BACKGROUND

Research into semiconductor packaging technologies has been actively conducted to provide light, thin, short, and small products. In particular, it has been significantly important to develop technologies for suppressing delamination or cracking of a redistribution via in spite of thermal stress and external impacts to maintain reliability of a package.

SUMMARY

The subject matter of the present disclosure relates to semiconductor packages including, e.g., semiconductor packages having improved reliability against thermal stress and external impacts.

In some implementations, a semiconductor package includes: a redistribution structure having a first surface and a second surface opposite to each other and including a plurality of redistribution layers, the plurality of redistribution layers including a first redistribution layer disposed on a first level adjacent to the first surface and a second redistribution layer disposed on a second level adjacent to the second surface; a semiconductor chip disposed on the first surface of the redistribution structure and including a contact pad connected to the first redistribution layer; a frame disposed on the first surface of the redistribution structure, having a cavity accommodating the semiconductor chip therein, and including a wiring structure connected to a first redistribution via of the first redistribution layer; a molding portion disposed on the first surface of the redistribution structure and encapsulating the semiconductor chip and the frame; and UBM layers disposed on the second surface of the redistribution structure and having a plurality of UBM vias, each of the plurality of UBM vias being connected to the second redistribution layer. The UBM layers may include at least one UBM layer overlapping the first redistribution via connected to the wiring structure in a thickness direction of the redistribution structure, and the first redistribution via may be disposed so as not to overlap the plurality of UBM vias of the at least one UBM layer and to overlap an internal region closer to a central point of the at least one UBM layer than the plurality of UBM vias.

In some implementations, a semiconductor package includes: a redistribution structure having a first surface and a second surface opposite to each other and including a plurality of redistribution layers, respectively having redistribution vias, the plurality of redistribution layers including a first redistribution layer disposed on a first level adjacent to the first surface, and a second redistribution layer disposed on a second level adjacent to the second surface; a semiconductor chip disposed on the first surface of the redistribution structure and including a contact pad connected to the first redistribution layer; a vertical connection conductor disposed around the semiconductor chip on the first surface of the redistribution structure and connected to the first redistribution layer, the first redistribution layer having a first redistribution via overlapping the vertical connection conductor; a molding portion disposed on the first surface of the redistribution structure and encapsulating the semiconductor chip and the vertical connection conductor; and UBM layers disposed on the second surface of the redistribution structure and respectively having a plurality of UBM vias connected to the second redistribution layer. The UBM layers may include at least one UBM layer overlapping the first redistribution via in a thickness of the redistribution structure, and the first redistribution via may be disposed so as not to overlap a plurality of UBM vias of the at least UBM layer and to overlap an internal region closer to a central point of the at least one UBM layer than the plurality of UBM vias.

In some implementations, a semiconductor package includes: a redistribution structure having a first surface and a second surface opposite to each other and including a plurality of redistribution layers disposed on different levels and respectively having redistribution vias formed to face the first surface, the plurality of redistribution layers including a first redistribution layer disposed on a first level adjacent to the first surface, and a second redistribution layer disposed on a second level adjacent to the second surface; a semiconductor chip disposed on the first surface of the redistribution structure and including a contact pad connected to the first redistribution layer; a vertical connection conductor disposed around the semiconductor chip on the first surface of the redistribution structure and connected to a first redistribution via of the first redistribution layer; a molding portion disposed on the first surface of the redistribution structure and covering the semiconductor chip and the vertical connection conductor; and UBM layers disposed on the second surface of the redistribution structure and respectively having a plurality of UBM vias connected to the second redistribution layer. The UBM layers may include at least one UBM layer overlapping the first redistribution via in a thickness of the redistribution structure, and the first redistribution via may be disposed so as not to overlap a plurality of UBM vias of the at least UBM layer and to overlap a region within 50 μm from a central point of the at least one UBM layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, various implementations will be described with reference to the accompanying drawings.

Figure 1:
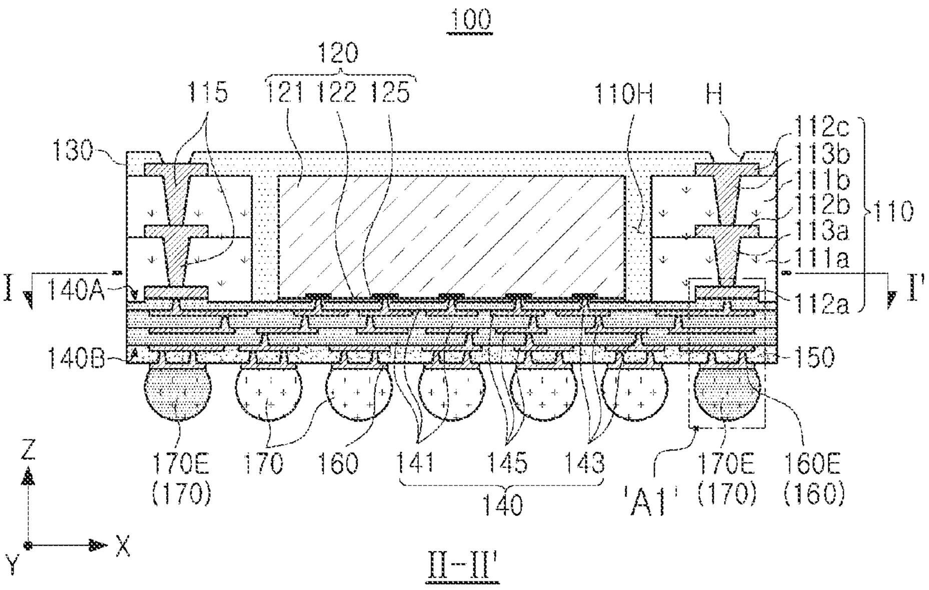
FIG. 1 is a cross-sectional side view of an example of a semiconductor package.
Figure 2A:
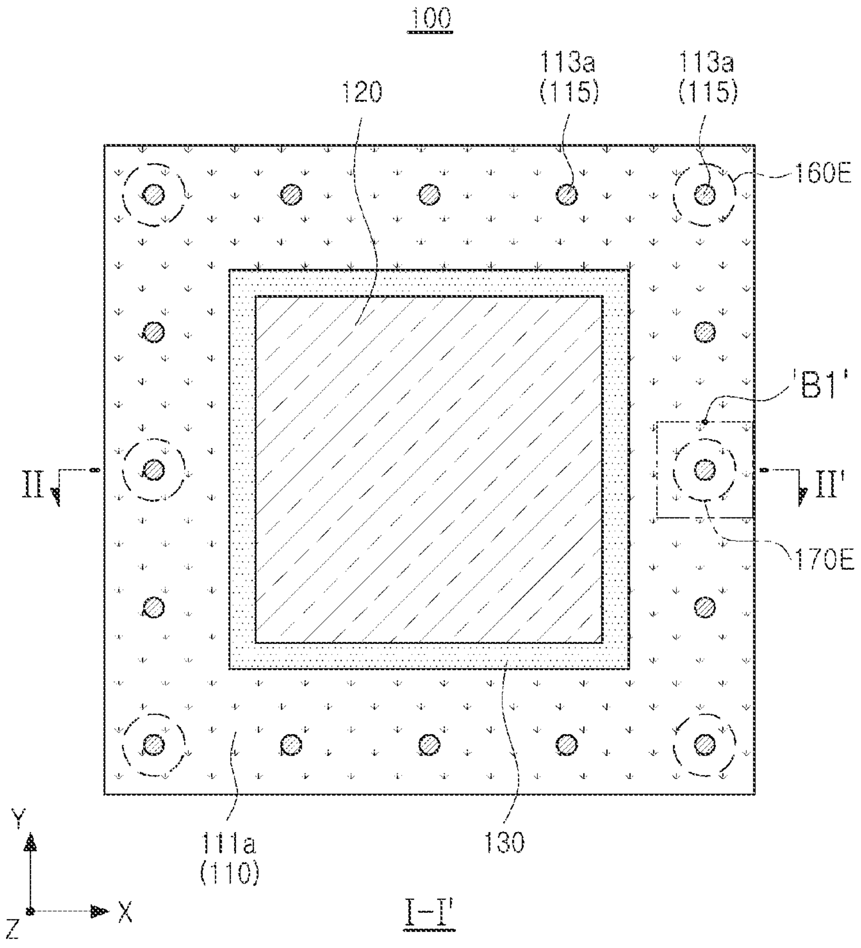
FIG. 2A is a plan view taken along line I-I' of the semiconductor package illustrated in FIG. 1.

FIG. 1 is a cross-sectional side view of an example of a semiconductor package. FIG. 2A is a plan view taken along line I-I' of the semiconductor package illustrated in FIG. 1, and FIG. 2B is a bottom view of the semiconductor package illustrated in FIG. 1.

Figure 2B:
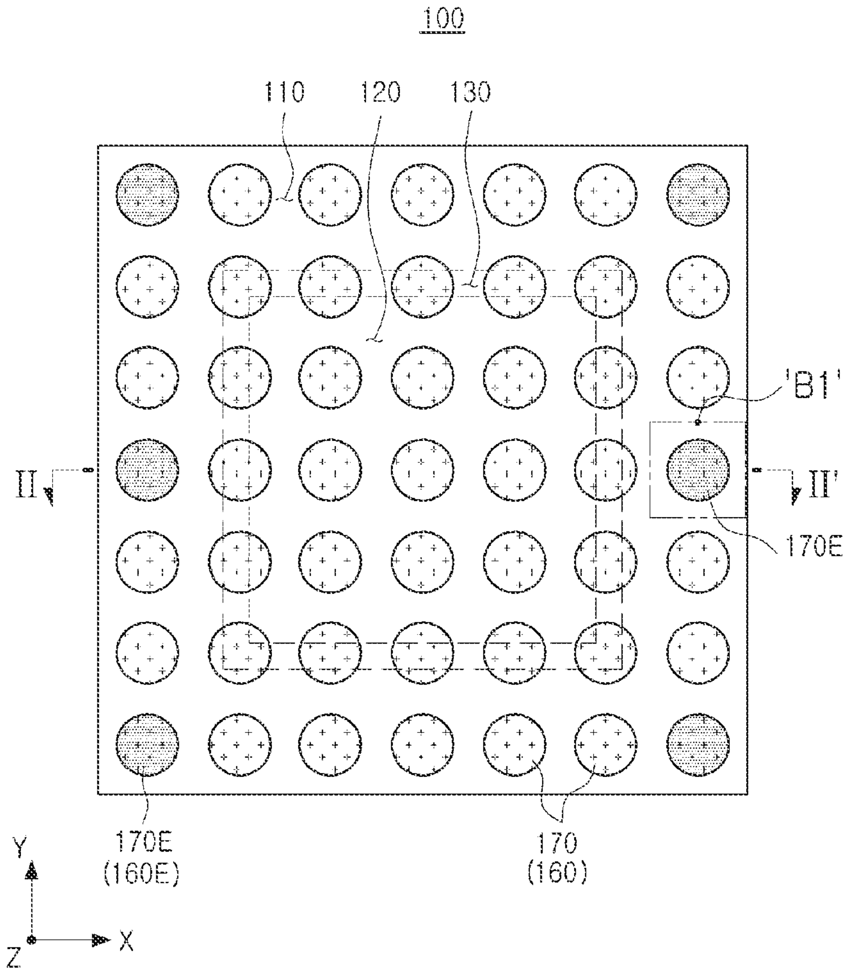
FIG. 2B is a bottom view of the semiconductor package illustrated in FIG. 1.

Referring to FIGS. 1, 2A, and 2B, a semiconductor package 100 may include a redistribution structure 140 having a first surface 140A and a second surface 140B disposed to oppose each other, a semiconductor chip 120 disposed on the first surface 140A of the redistribution structure 140, e.g., stacked along a thickness direction (the Z-direction), and a molding portion 130 disposed on the first surface 140A of the redistribution structure 140 and encapsulating the semiconductor chip 120. The semiconductor package 100 may further include a frame 110, a passivation layer 150, an underbump metallization (UBM) layer 160, and an electrical connection metal 170.

The redistribution structure 140 may include a redistribution layer 145 redistributing a contact pad 125 of the semiconductor chip 120. The redistribution structure 140 may be physically and/or electrically connected to an external device (for example, a mainboard) through the UBM layer 160 and the electrical connection metal 170.

The redistribution structure 140 may include an insulating member including a plurality of insulating layers 141, a redistribution layer 145 disposed on each insulating layer 141, and a redistribution via 143 penetrating through the insulating layer 141 and connecting the contact pad 125 of the semiconductor chip 120 and the redistribution layer 145 of a different level to each other. The redistribution structure 140 in FIG. 1 is illustrated as including three insulating layers 141 and three redistribution layers 145 each having a redistribution via 143, but may be implemented to include one or two, or more insulating layers 141 and redistribution layers 145 in another example (see FIG. 9).

The frame 110 may be disposed on the first surface 140A of the redistribution structure 140 together with the semiconductor chip 120, and the redistribution layer 145 (for example, a first redistribution layer (145*a* of FIG. 3) disposed in an uppermost portion) may be respectively connected to the contact pad 125 of the semiconductor chip 120 and a wiring structure 115 by redistribution vias 143 and 143E.

The passivation layer 150 may be introduced to protect the redistribution structure 140 from external physical and chemical damages. For example, the passivation layer 150 may include an insulating material such as prepreg, Ajinomoto Build-up Film (ABF), Frame Retardant 4 (FR-4), Bismaleimide Triazine (BT), a solder resist, or a photoimageable dielectric (PID).

The UBM layer 160 may be disposed on the second surface 140B of the redistribution structure 140. For example, the UBM layer 160 may be formed to be connected to one region of a redistribution layer (for example, a lowermost third redistribution layer (145*c* of FIG. 3)) exposed by an opening of the passivation layer 150 or a lowermost insulating layer 141 of the redistribution structure 140. The UBM layer 160 may be formed by a known metallization method using a known conductive material, for example, a metal.

Each of the UBM layers 160 may include a plurality of UBM vias 165. Stress, transferred through the electrical connection metal 170 such as a solder ball, may be distributed on a board level (for example, in the state in which the semiconductor package 100 is mounted on the mainboard). As a result, the redistribution structure 140 (for example, the redistribution layer 145 and a connection thereto) may be protected from stress, caused by a difference in coefficients of thermal expansion between the mainboard and the redistribution structure 140, during a soldering process. In some implementations, the plurality of UBM vias 165 may be formed in a different numbers and arrangements (see FIGS. 6 and 7).

The electrical connection metal 170 may be disposed on the UBM layer 160 and may be used to physically and/or electrically connect the semiconductor package 100 to an external device such as a mainboard. The electrical connection metal 170 may include a low-melting-point metal, for example, a solder such as tin-aluminum-copper (Sn—Al—Cu). The electrical connection metal 170 may have be a multilayer structure or a single-layer structure. For example, the multilayer structure may include a copper pillar and a solder, and the single-layer structure may include a tin-silver solder or copper. The number, interval, arrangement, and the like, of the electrical connection metals 170 are not limited. The number of electrical connection metals 170 is illustrated as being 49 in FIG. 2B, but hundreds to thousands (or more) of electrical connection metals 170 may be provided.

Referring to FIGS. 2A and 2B together with FIG. 1, a portion of the UBM layer 160 and the electrical connection metal 170 may be disposed in a region overlapping the semiconductor chip 120, so-called a "fan-in" region, and another portion thereof may be disposed in a region which does not overlap the semiconductor chip 120, so-called a "fan-out" region.

Figure 3:
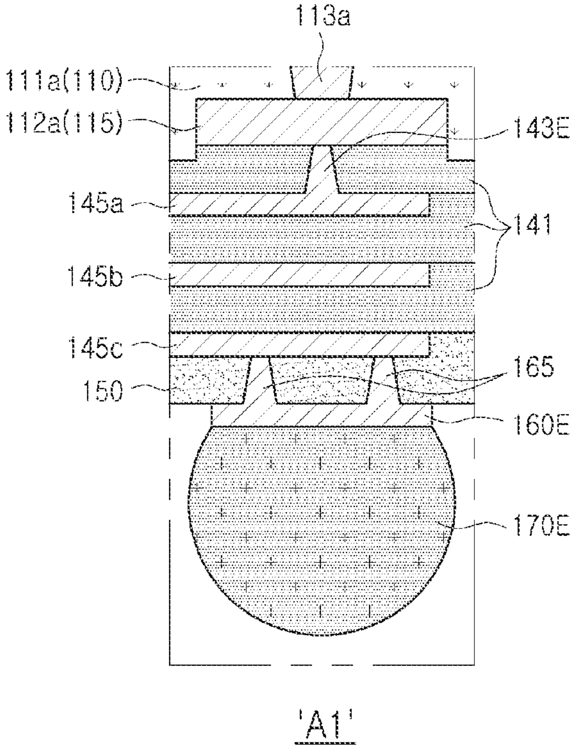
FIG. 3 is a partially enlarged view of portion "A1" of the semiconductor package illustrated in FIG. 1.

As described above, the wiring structure 115 of the frame 110 may be connected to the first redistribution layer 145*a* of the redistribution structure 140. A portion of the wiring structure 115, connected to a top redistribution layer 145*a*, may overlap a portion of the UBM layer 160E or a portion of the electrical connection conductor (e.g., metal) 170E in a thickness direction (for example, a Z-direction) of the redistribution structure 140. FIG. 3 is a partially enlarged view of portion "A1" of the semiconductor package illustrated in FIG. 1.

For example, referring to FIGS. 1 and 3, a first wiring layer 112*a* of the wiring structure 115 may be connected to the top redistribution layer 145*a* by the redistribution via 143E. Among the plurality of UBM layers 160, at least one UBM layer 160E may overlap a redistribution via 143E, connected to the wiring structure 115 of the redistribution structure 140, in the thickness direction (for example, the Z-direction) of the redistribution structure 140.

In plan view, referring to FIGS. 2A and 2B, an electrical connection conductor 170 such as a solder ball may be disposed on each of the UBM layers 160. Among the UBM layers 160, a portion (illustrated in bold) of the UBM layer disposed in the fan-out region may be the UBM layer 160E overlapping the wiring structure 115. The overlapping UBM layers 160E may overlap the wiring structure 115, for example, the redistribution via 143E connected to the first wiring via 113*a*, as illustrated in FIG. 3.

In the present specification, "at least one UBM layer 160E" overlapping the redistribution via 143E connected to the wiring structure 115 is also referred to as an "overlapping UBM layer." A redistribution via 143E, overlapping the overlapping UBM layer 160E and connected to the wiring structure 115, is also referred to as a "top (overlapping) RDL via" or a "first redistribution via." Even when the term "overlap" is used unless a direction is explicitly stated, it will be understood that components overlap each other in a thickness direction of the redistribution structure 140, for example, along the Z-direction.

On the board level, the stress transferred through the electrical connection conductor 170 may have a greater effect on the UBM layers 160, disposed to be adjacent to an edge of the redistribution structure (for example, the fan-out region) than the UBM layers 160 disposed in an internal region (for example, the fan-in region) of the redistribution structure 140. This is because, among the UBM layers 160 disposed to be adjacent to an edge or a corner, the number of UBM layers 160 which may be dispersed around the edge or the corner is smaller than the number of UBM layers 160 disposed in the internal region.

Accordingly, as illustrated in FIG. 2B, the overlapping UBM layers 160E are disposed on each edge of the second surface 140B of the redistribution structure 140 or in a region adjacent thereto, so that a relatively large amount of stress may be concentrated and the stress transferred to the overlapping UBM layers 160E may be transferred to a top redistribution via 143E overlapping the overlapping UBM layer 160E. Thus, delamination or cracking may easily occur between the redistribution via 143E and the wiring structure 115.

Figure 4:
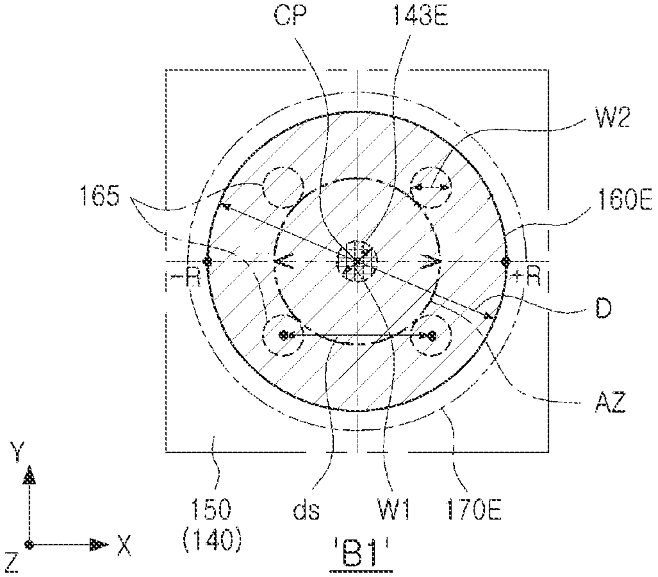
FIG. 4 is a partially enlarged view of portion "B1" of the semiconductor package illustrated in FIG. 2B.

To address the above issue, the semiconductor package 100 provides a method of reducing stress, transmitted from the electrical connection conductor 170E and the overlapping UBM layer 160E, by adjusting a location of the top redistribution via 143E. FIG. 4 is a partially enlarged view of portion "B1" of the semiconductor package illustrated in FIG. 2B.

Referring to FIG. 4 together with FIG. 3, the top overlapping redistribution via 143E may be disposed so as not to overlap the plurality of UBM vias 165 of the overlapping UBM layer 160E and to overlap a central point CP of the overlapping UBM layer 160E rather than the plurality of UBM vias 165. In some implementations, the central point CP of the overlapping UBM layer 160E may be defined as a point having the same distance from the four UBM vias 165. Since the top overlapping redistribution via 143E is disposed to overlap the central point CP of the overlapping UBM layer 160E, stress propagating to the top overlapping redistribution via 143E may also be significantly reduced (see FIG. 5).

In some implementations, each of the redistribution vias 143 and 143E may have a width W1, similar to a width W2 of the UBM via 165. For example, each of the widths W1 and W2 of the redistribution vias 143 and 143E and the UBM via 165 may range from 10 μm to 50 μm. For example, a width D of the UBM layer 160 may range from 150 μm to 250 μm. A distance ds between adjacent vias, among the plurality of UBM vias 165, may range from 100 μm to 200 μm.

Figure 5:
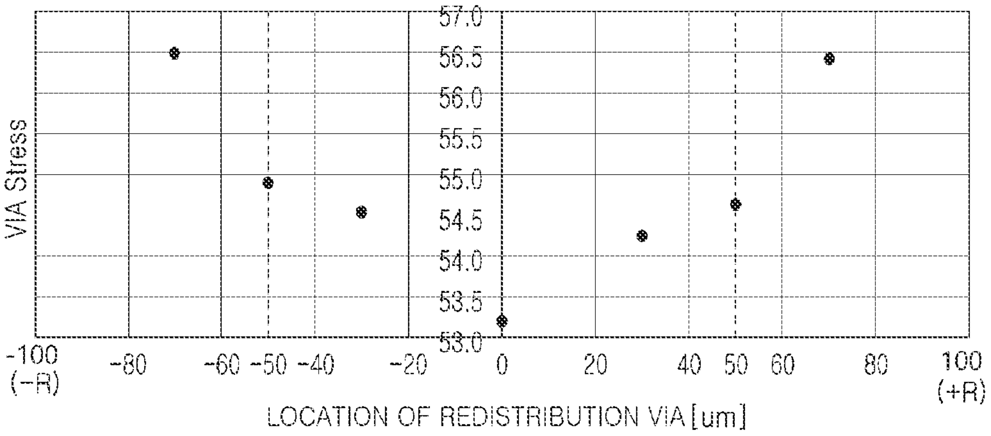
FIG. 5 is a graph illustrating a change in stress, applied to a redistribution via, depending on a location of the redistribution via.

FIG. 5 is a graph illustrating a change (a simulation result) of stress applied to the redistribution via 143E depending on a location of the redistribution via 143E.

A change in pressure applied to the top overlapping redistribution via 143 was simulated while changing a location of the top redistribution via 143E along a diameter line in an X-direction passing through the central point CP of the overlapping UBM layer 160E under conditions in which a diameter D of the UBM layer 160E is 200 μm, respective widths W1 and W2 of the redistribution via 143E and the UBM via 165 are 25 μm, and a distance ds between two adjacent UBM vias 165 is 150 μm. A result of the simulation is illustrated as the graph of FIG. 5.

Referring to FIG. 5, when the top redistribution via 143E overlapped the central point CP of the overlapping UBM layer 160E, lowest stress (for example, 53.2 MPa) was exhibited. As an overlapping location of the top redistribution via 143E is distant from the central point CP, the stress tended to be increased. For example, relatively low stress of less than 55 MPa was exhibited within a range of ±50 μm from the central point CP, but relatively high stress of 56.5 MPa was exhibited within a range of ±70 μm outside of the above range.

Accordingly, even when the location of the top overlapping redistribution via 143E does not overlap the central point CP of the UBM layer 160E, the top overlapping redistribution via 143E may be disposed so as not to overlap the plurality of UBM vias 165 of the overlapping UBM layer 160E and to overlap an internal region AZ closer to the central point CP of the overlapping UBM layer 160E than the plurality of UBM vias 165. Even in this case, the stress concentrated on the top overlapping redistribution via 143E may be significantly reduced. This will be described later in detail with reference to FIG. 6.

Hereinafter, major components of the semiconductor package 100 will be described in more detail.

As described above, the redistribution structure 140 employed in the semiconductor package 100 may include a plurality of insulating layers 141 and a plurality of redistribution layers 145, respectively formed on the plurality of insulating layers 141. For example, the insulating layer 141 may be formed of a photosensitive insulating material such as a photoimageable dielectric (PID) resin. When the insulating layer 141 has photosensitive properties, the insulating layer 141 may be formed to be thinner, and a fine pitch of the redistribution via 143 may be more easily implemented using a photolithography process. In some implementations, the insulating layer 141 may include a thermosetting resin such as an epoxy resin, or a thermoplastic resin such as polyimide.

For example, the redistribution layer 145 may include copper (Cu), aluminum (Al), silver (Ag), tin (Sn), gold (Au), nickel (Ni), lead (Pb), titanium (Ti), or alloys thereof. In some implementations, the redistribution layer 145 may include additional patterns having various functions. For example, the redistribution layer 145 may include a pattern for grounding, other than a pattern for a signal and a pattern for power. On the same level, the redistribution via 143 may be formed together with the redistribution layer 145 using the same plating process. The redistribution via may have a tapered structure determined depending on a formation direction. In some implementations, the redistribution via 143 may have a width narrowed in a direction toward the first surface 140A, and the redistribution structure 140 may include a first redistribution layer 145*a*, a second redistribution layer 145*b*, and a redistribution layer 145*c* formed sequentially.

The frame 110 may further improve rigidity of the semiconductor package 100 depending on a specific material, and may serve to secure thickness uniformity of the molding portion 130, e.g., an encapsulant, or the like. As described above, the frame 110 has a wiring structure 115 connecting the upper and lower surfaces thereof to each other, so that the semiconductor package 100A may be used as a package-on-package (POP) type package. An upper surface of the wiring structure 115, exposed from an opening H of the molding portion 130, for example, a region of the third wiring layer 112*c*, may be provided as a pad for electrical connection to an overlying device such as an upper semiconductor package, not illustrated. In this case, a surface processing layer, not illustrated, may be further formed in the exposed region of the third wiring layer 112*c*.

A semiconductor chip 120, disposed in a cavity 110H of the frame 110, may be spaced apart from an internal sidewall of the frame 110 by a predetermined distance. The semiconductor chip 120 may be surrounded by the frame 110. However, this is only an example, and the frame 110 may be modified to have various other forms and may perform different functions based on the various forms. For example, the frame 110 may have a plurality of cavities, and different semiconductor chips or other components (for example, capacitors) may be accommodated in each of the cavities.

The frame 110 may be connected to the redistribution structure 140 and may include a wiring structure 115 electrically connected to the semiconductor chip 120 by the redistribution structure 140. In some implementations, the frame 110 may include a first insulating layer 111*a*, a first wiring layer 112*a* contacting the redistribution structure 140 and buried in the first insulating layer 111*a*, a second wiring layer 112*b* disposed on a side opposing the side in which the first wiring layer 112*a* of the first insulating layer 111*a* is buried, a second insulating layer 111*b* disposed on the first insulating layer 111*a* and covering the second wiring layer 112*b*, and a third wiring layer 112*c* disposed on the second insulating layer 111*b*. The first, second, and third wiring layers 112*a*, 112*b*, and 112*c* may be electrically connected to each other through first and second wiring vias 113*a* and 113*b*, respectively penetrating through the first and second insulating layers 111*a* and 111*b*.

In some implementations, when the first wiring layer 112*a* is buried in the first insulating layer 111*a* (as depicted in FIG. 3), a step caused by a thickness of the first wiring layer 112*a* may be significantly reduced, so that an insulation distance of the redistribution structure 140 may be implemented to be more uniform. As the first insulating layer 111*a* is recessed into the first wiring layer 112*a*, a lower surface of the first insulating layer 111*a* may have a step with respect to a lower surface of the first wiring layer 112*a*. In this case, a material of the molding portion 130 may be prevented from bleeding and contaminating the first wiring layer 112*a* during formation of the molding portion 130. The frame 110 may be manufactured to have a sufficient thickness by a substrate process, or the like. The redistribution structure 140 may be manufactured to have a low thickness by a semiconductor process, or the like. Therefore, a thickness of each of the first, second, and third wiring layers 112*a*, 112*b*, and 112*c* of the frame 110 may be higher than a thickness of each of the redistribution layers 142 of the redistribution structure 140.

For example, the first and second insulating layers 111*a* and 111*b* may include a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. For example, the first, second, and third wiring layers 112*a*, 112*b*, and 112*c* may include a conductive material such as copper (Cu), aluminum (Al), silver (Ag), tin (Sn), gold (Au), nickel (Ni), lead (Pb), titanium (Ti), or alloys thereof. The first, second, and third wiring layers 112*a*, 112*b*, and 112*c* may perform various functions depending on designs of corresponding layers. For example, the first, second, and third wiring layers 112*a*, 112*b*, and 112*c* may include a pattern for grounding, other than a pattern for power and a pattern for a signal. When the first, second, and third wiring layers 112*a*, 112*b*, and 112*c* are formed by the same plating process, the first and second wiring vias 113*a* and 113*b* may be integrated with the second and third wiring layers 112*b* and 112*c*, respectively.

The semiconductor chip 120 may include a semiconductor body 121 having an active surface on which various circuit devices are formed, contact pads 125 connected to the circuit devices, and a passivation layer 122 protecting the active surface. The semiconductor body 121 may include, for example, silicon (Si), germanium (Ge), or gallium-arsenide (GaAs). The contact pad 125 may be an element electrically connecting the semiconductor chip 120 to another element (the redistribution layer 145), and may include, for example, aluminum (Al) or copper (Cu). The passivation layer 122 may include an oxide layer and/or a nitride layer.

The semiconductor chip 120 may be a processor chip. For example, the semiconductor chip 120 may include a microprocessor, a graphics processor, a signal processor, a network processor, a chipset, an audio codec, a video codec, an application processor, a system-on-chip (SoC), an application-specific integrated circuit (ASIC), or a power management integrated circuit (PMIC), but the present disclosure is not limited thereto. For example, the microprocessor may include a single core or multiple cores. In some implementations, the semiconductor chips 120 may be a volatile memory chip and/or a nonvolatile memory chip. For example, the volatile memory chip may include a dynamic random access memory (DRAM), a static RAM (SRAM), a thyristor RAM (TRAM), a zero capacitor RAM (ZRAM), or a twin transistor RAM (TTRAM). For example, the non-volatile memory chip may include a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano-floating gate memory, a holographic memory, a molecular electronics memory, or an insulator resistance change memory.

The molding portion 130 may protect the frame 110 and the semiconductor chip 120. A material of the molding portion 130 may include, for example, a thermosetting resin such as an epoxy resin, or a thermoplastic resin such as polyimide. In some implementations, the molding portion 130 may be formed of an epoxy molding compound (EMC).

Figure 6:
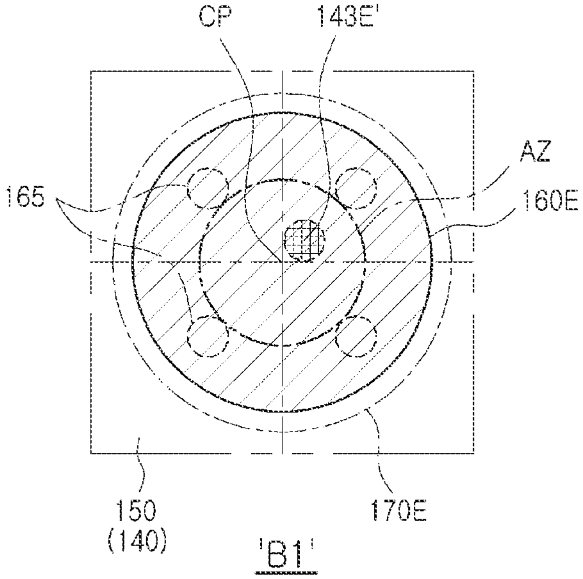
FIGS. 6 to 8 are schematic diagrams illustrating an arrangement of a redistribution via and an underbump metallization (UBM) layer employable in an example of a semiconductor package.
Figure 7:
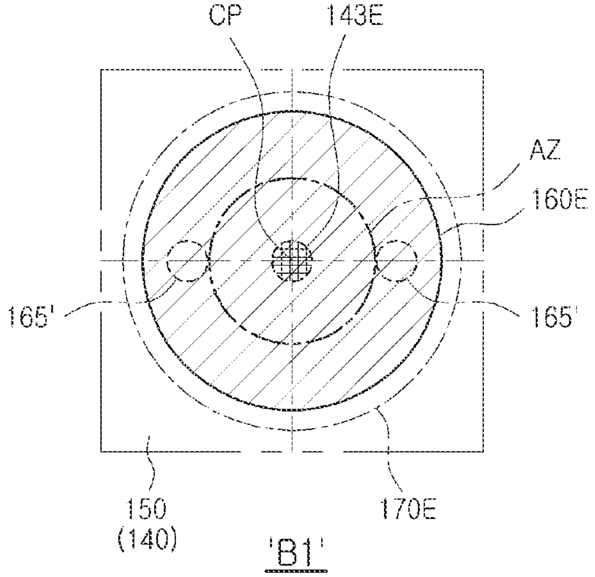
Figure 8:
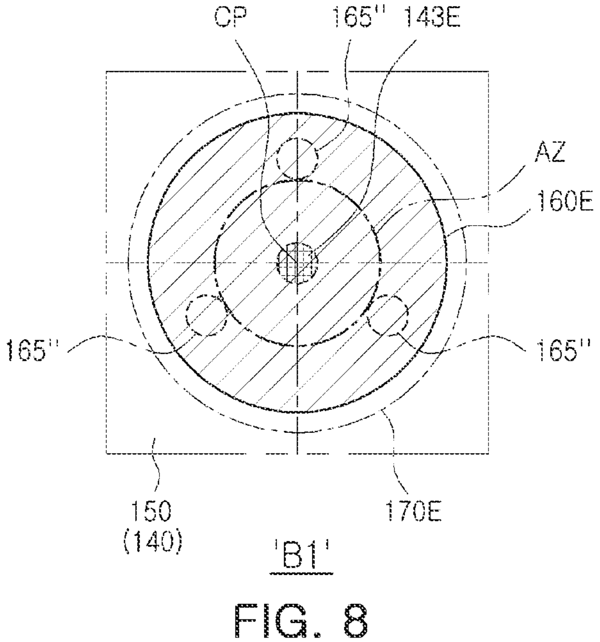

FIGS. 6 to 8 are schematic views illustrating an arrangement of redistribution vias and UBM layers employable in an example of a semiconductor package, and may be understood as enlarged plan views of a portion corresponding to FIG. 4. The descriptions provided in FIGS. 1 to 5 may be incorporated in FIGS. 6 to 8 by reference, unless otherwise specified.

Referring to FIG. 6, unlike the implementation shown in FIG. 4, a top overlapping redistribution via 143E' may be outside of a central point CP of a UBM layer 160E, but may be disposed to overlap an internal region AZ closer to a central point CP of an overlapping UBM layer 630E than a plurality of UBM vias 165.

In some implementations, even when the top overlapping redistribution via 143E' does not overlap the central point CP of the UBM layer 160E, the top overlapping redistribution via 143E' may be disposed to overlap the internal region AZ closer to the central point CP of the overlapping UBM layer 630E than the plurality of UBM vias 165.

As described above, the top overlapping redistribution via 143E' may be disposed so as to not overlap the plurality of UBM vias 165 of the overlapping UBM layer 160E but to instead overlap the internal region AZ that is closer to the central point CP of the at least one UBM layer 160 than the plurality of UBM vias 165. In some implementations, the top overlapping redistribution via 143E' overlaps the internal region AZ without overlapping the central point CP itself. Thus, stress concentrated on the top overlapping redistribution via 143E' may be significantly reduced. The internal region AZ may be defined as a region surrounded at a distance of 25% of a width D of the overlapping UBM layer 160E. In some implementations, the internal region AZ may be defined as a region within 50 μm from the central point CP of the overlapping UBM layer 160E. As described in the graph of FIG. 5, the closer the top overlapping redistribution via 143E' is to the center CP of the UBM layer 160E, the less stress. Therefore, reliability of a semiconductor package may be further improved.

Referring to FIG. 7, an overlapping UBM layer 160E may have two UBM vias 165'. A top overlapping redistribution via 143E may be disposed to overlap a central point CP of the overlapping UBM layer 160E disposed at substantially the same distance from the two UBM vias 165'. Even in this case, even when the top redistribution via 143E does not overlap the central point CP and is disposed in a region between the two UBM vias 165', for example, the internal region AZ closer to the central point CP of the overlap UBM layer 160E than the two UBM vias 165' without overlapping the UBM vias 165', a similar stress reduction effect may be expected.

Referring to FIG. 8, an overlapping UBM layer 160E may have three UBM vias 165". A top overlapping redistribution via 143E may be disposed at substantially the same distance from the three UBM vias 165", for example, a center of gravity CP. Even when the top overlapping redistribution via 143E does not overlap the center CP and is disposed in an internal region AZ closer to a center of an overlapping UBM layer 160E than the three UBM vias 165" without overlapping the three UBM vias 165", a similar stress reduction effect may be expected.

Figure 9:
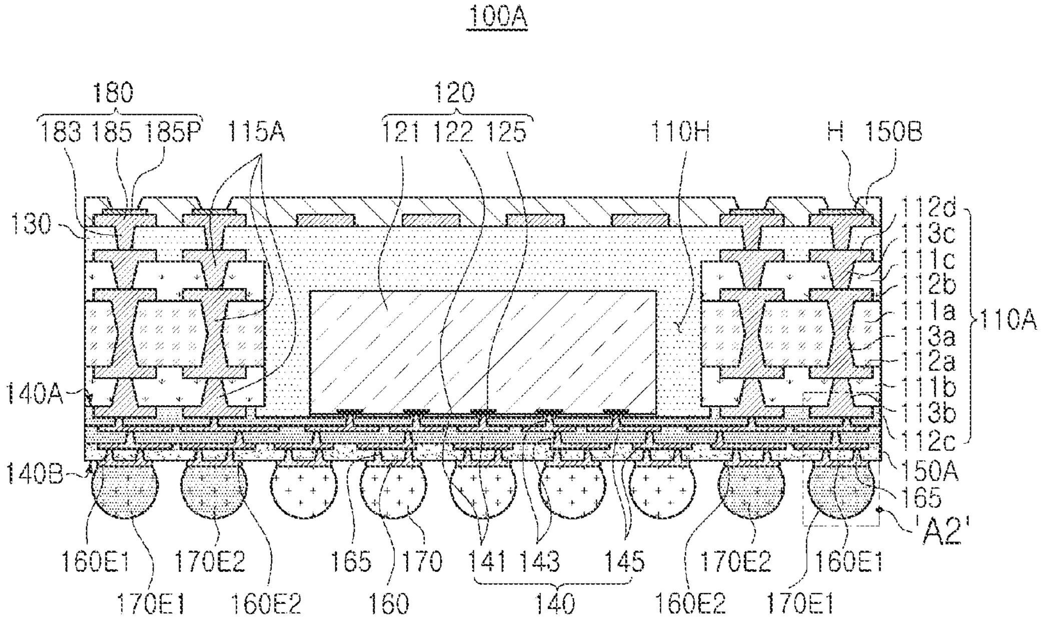
FIG. 9 is a cross-sectional side view of an example of a semiconductor package.

FIG. 9 is a cross-sectional side view of an example of a semiconductor package, and FIG. is a bottom view of the semiconductor package illustrated in FIG. 9.

Figure 10:
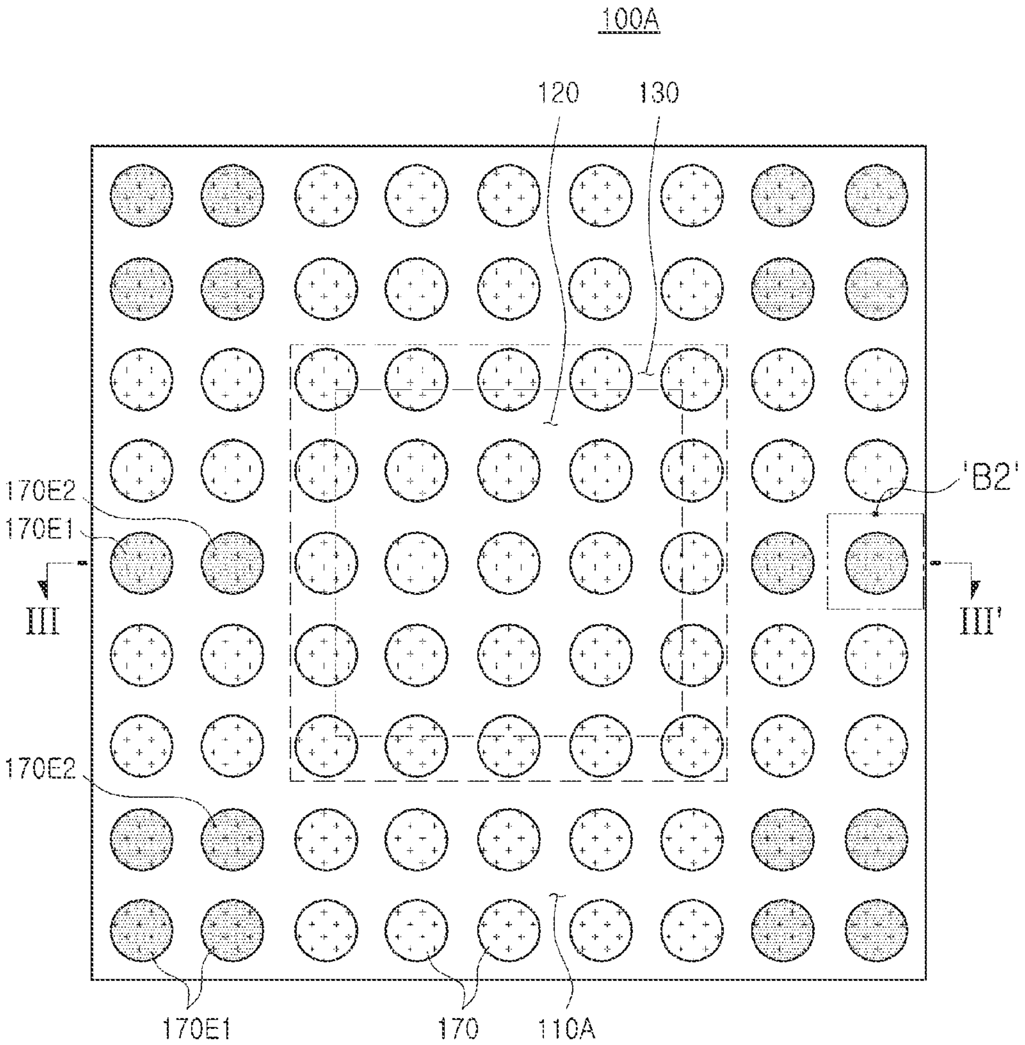
FIG. 10 is a bottom view of the semiconductor package illustrated in FIG. 9.

Referring to FIGS. 9 and 10, a semiconductor package 100A may be understood to be similar to the semiconductor package 100 illustrated in FIGS. 1 to 4, except that a lower redistribution layer 145 additionally includes an upper redistribution layer 185 while having a double-layer structure, an arrangement of overlapping redistribution vias 143*a* and 143*b* is different from that illustrated in FIGS. 1 to 4, frame 110A and a wiring structure 115A have structures, different from those illustrated in FIGS. 1 to 4, and an arrangement of a UBM layer 160 and an electrical connection conductor 170 is different from that illustrated in FIGS. 1 to 4. Components of semiconductor package 100A may be understood with reference to the description of the same or similar components of the semiconductor package 100 illustrated in FIGS. 1 through 4 unless explicitly described to the contrary.

Referring to FIG. 10, the arrangement of the UBM layer 160 and the electrical connection conductor 170 may be different from that of the arrangement in FIG. 2B. In FIG. 10, the UBM layer 160 and the electrical connection conductor 170 disposed in a fan-out region may be arranged in a plurality of rows (for example, two rows). In addition, a UBM layer 160E overlapping a wiring structure 115 (or a top redistribution via 143E connected thereto) may also be disposed in a first row closest to an edge, as well as a second row next closest to the edge. Similar to the semiconductor package 100, a top redistribution via disposed in a second column may be disposed to overlap a central point of a UBM layer 160E2. However, unlike semiconductor package 100, a redistribution via 143*a* disposed in a first column may be disposed to overlap an overlapping UBM layer 160E2 together with the redistribution via 143*b* of another level in semiconductor package 100*a*.

Figure 11:
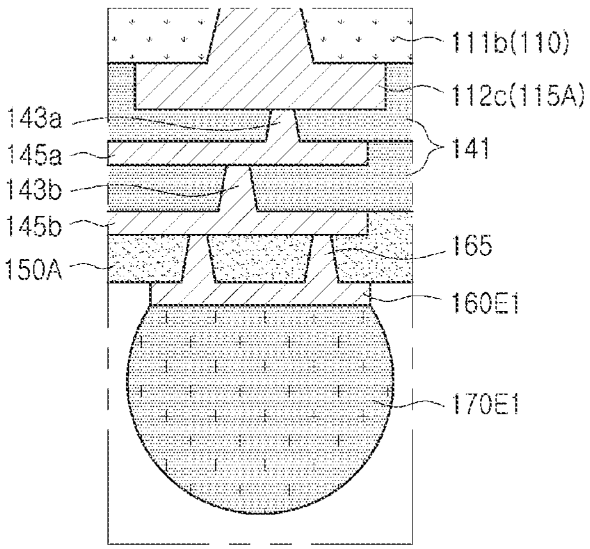
FIG. 11 is a partially enlarged view of portion "A2" of the semiconductor package illustrated in FIG. 9.

Referring to FIG. 10, an outermost overlapping UBM layer 160E1 may be disposed to overlap the first redistribution via 143*a*, a top redistribution via, together with the second redistribution via 143*b* of another level. FIG. 11 is a partially enlarged view of portion "A2" of the semiconductor package illustrated in FIG. 9, and FIG. 12 is a partially enlarged view of portion "B2" of the semiconductor package illustrated in FIG. 10.

Figure 12:
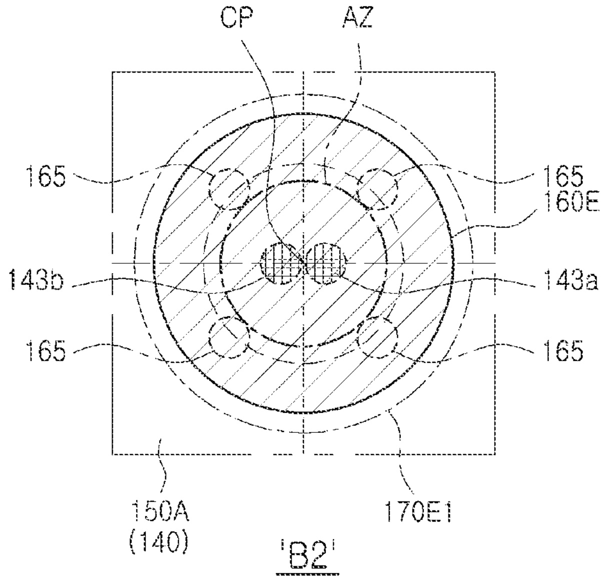
FIG. 12 is a partially enlarged view of portion "B2" of the semiconductor package illustrated in FIG. 10.

Referring to FIGS. 11 and 12, both the first and second redistribution vias 143*a* and 143*b*, overlapping the overlapping UBM layer 160E1, may be disposed so as not to overlap four UBM vias 165 and may be disposed in an internal region AZ closer to the central point CP of the overlapping UBM layer 160E1 than the four UBM vias 165. In addition, the first and second redistribution vias 143*a* and 143*b* may be arranged so as not to overlap each other.

Figure 14:
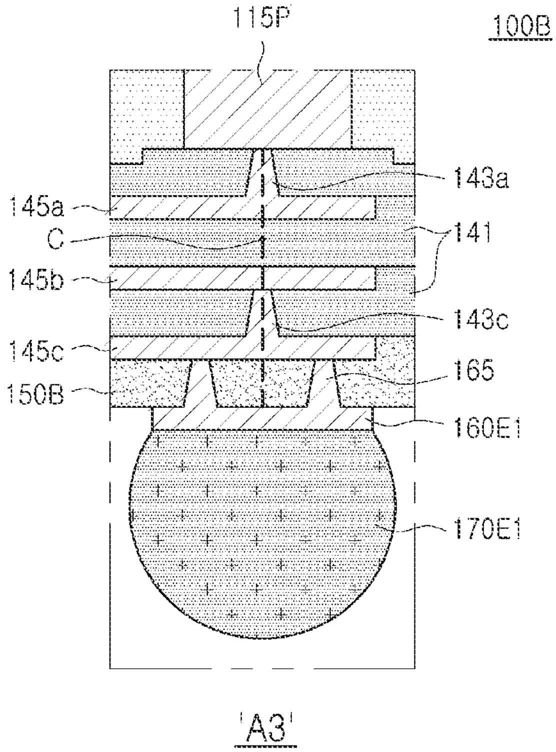
FIG. 14 is a partially enlarged view of portion "A3" of the semiconductor package illustrated in FIG. 13.

In some implementations, a redistribution via of another level, overlapping an overlapping UBM layer 160E1, may also be disposed to be coaxial with a top redistribution via (see FIG. 14).

In addition, the frame 110A may have a different structure from the implementations already disclosed, e.g., frame 110. Therefore, a wiring structure 115A may be modified compared to wiring structure 115, as the shape of the wiring structure depends on the corresponding frame.

For example, as illustrated in FIG. 9, the frame 110A may include a first insulating layer 111*a*, a first wiring layer 112*a* disposed on one surface of the first insulating layer 111*a*, a second wiring layer 112*b* disposed on the other surface of the first insulating layer 111*a*, a second insulating layer 111*b* disposed on one surface of the first insulating layer 111*a* to cover at least a portion of the first wiring layer 112*a*, a third wiring layer 112*c* disposed on a surface, opposing a side in which the first wiring layer 112*a* of the second insulating layer 111*b* is buried, a third insulating layer 111*c* disposed on the other surface of the first insulating layer 111*a* to cover at least a portion of the second wiring layer 112*b*, and a fourth wiring layer 112*d* disposed on a surface, opposing a side in which the second wiring layer 112*b* of the third insulating layer 111*c* is buried. The frame 110A may further include a first wiring via 113*a* penetrating through the first insulating layer 111*a* and electrically connecting the first and second wiring layers 112*a* and 112*b* to each other, a second wiring via 113*b* penetrating through the second insulating layer 111*b* and electrically connecting the first and third wiring layers 112*a* and 112*c* to each other, and a third wiring via 113*c* penetrating through the third insulating layer 111*c* and electrically connecting the second and fourth wiring layers 112*b* and 112*d* to each other. Since the frame 110A employed in the semiconductor package 100A has a greater number of wiring layers, e.g., first through fourth wiring layers 112*a*, 112*b*, 112*c*, and 112*d*, the redistribution layer 145 of the redistribution structure 140 may be further simplified.

The semiconductor package 100A may have an upper redistribution structure 180 on an upper surface of a molding portion 130. The upper redistribution structure 180 may include an upper redistribution layer 185 and a via 183 penetrating through a region of the molding portion 130 to be connected to a wiring structure. In semiconductor package 100A, the upper redistribution layer 185 is illustrated as a single layer, but may be implemented as a plurality of redistribution layers in some implementations. Similarly to a lower redistribution structure 140, the upper redistribution structure 180 may further include an insulating layer disposed between a plurality of redistribution layers.

An upper passivation layer 150B may be formed on the molding portion 130 to cover the upper redistribution layer 185. The upper passivation layer 150B may have an opening H exposing a region of the upper redistribution layer 185. The exposed region of the upper redistribution layer 185 may be provided as a pad for connection to an external device (for example, an upper semiconductor package for a POP structure). A surface processing layer 185P may be formed in the exposed region to be provided as a pad, using an additional plating process. The upper passivation layer 150B may be formed of a material the same as or similar to a material of the above-described lower passivation layer 150A.

Figure 15:
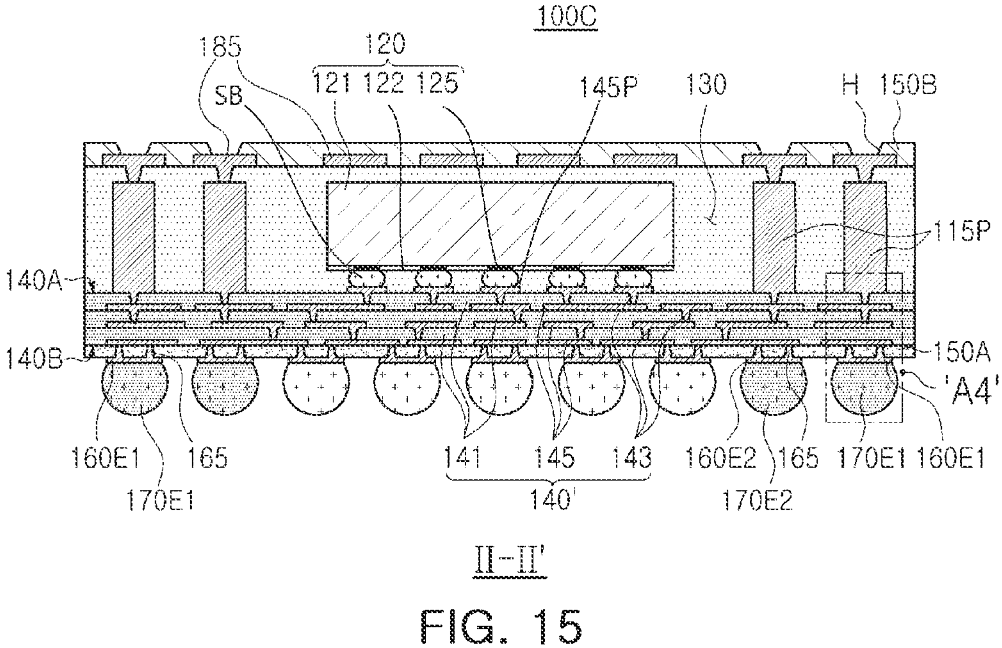
FIG. 15 is a cross-sectional side view of an example of a semiconductor package.

In semiconductor package 100A, a vertical interconnect conductor connected to a redistribution layer of a redistribution structure and extending to an upper surface of a semiconductor package has been illustrated as being implemented as a wiring structure of a frame. However, the vertical connection conductor may be disposed on the redistribution structure without a frame structure and may be provided as a conductive post penetrating through a molding portion, as illustrated in FIGS. 13 and 15.

Figure 13:
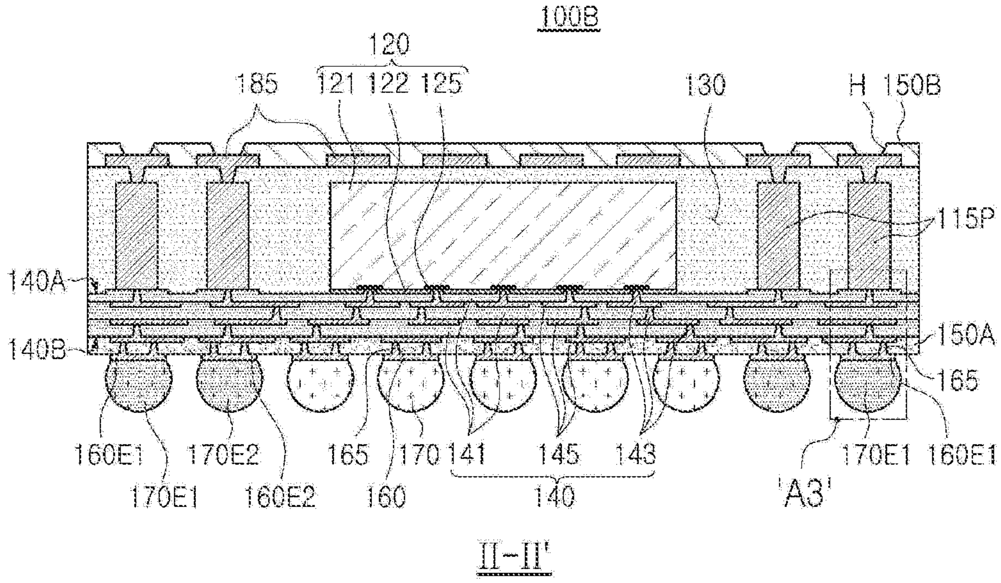
FIG. 13 is a cross-sectional side view of an example of a semiconductor package.

FIG. 13 is a cross-sectional side view of an example of a semiconductor package 100B, and FIG. 14 is a partially enlarged view of portion "A3" of the semiconductor package 100B illustrated in FIG. 13.

Referring to FIGS. 13 and 14, the semiconductor package 100B may be understood to be similar to the semiconductor package 100 illustrated in FIGS. 1 to 4, except that a conductive post 115P is provided instead of a frame, an arrangement of overlapping redistribution vias 143*a* and 143*b* is different from that illustrated in FIGS. 1 to 4, and an upper redistribution layer 185 is provided. Therefore, the description of the semiconductor package 100 illustrated in FIGS. 1 to 4 may be incorporated in the description of the semiconductor package 100B unless explicitly described to the contrary.

Unlike semiconductor package 100A, the semiconductor package 100B may be a semiconductor package manufactured on a wafer level. The conductive post 115P such as a copper (Cu) post, rather than a wiring structure of a frame, may be provided as a vertical connection conductor for connecting an upper redistribution layer 185 and a lower redistribution layer 145 to each other. The conductive post 115P may be formed to penetrate through a molding portion 130 sealing a semiconductor chip 120, and may electrically connect the lower redistribution layer 145 and the upper redistribution layer 185 to each other. The upper redistribution layer 185 may be disposed on the molding portion 130 and may have a via 183 penetrating through a region of the molding portion 130 to be connected to the conductive post 115P.

An upper passivation layer 150B may be formed on the molding portion 130 to cover the upper redistribution layer 185. The upper passivation layer 150B may have an opening H exposing a region of the upper redistribution layer 185. The exposed region of the upper redistribution layer 185 may serve as a pad for connection to an external device (for example, an upper semiconductor package for a POP structure). The upper passivation layer 150B may be formed of a material the same as or similar to a material of the above-described lower passivation layer 150A.

The semiconductor package 100B may be manufactured in a manner of forming the molding portion 130 to cover the semiconductor chip 120 and the conductive post 115P and then building-up the redistribution structure 140 on a lower surface of the molding portion 130.

Figure 16:
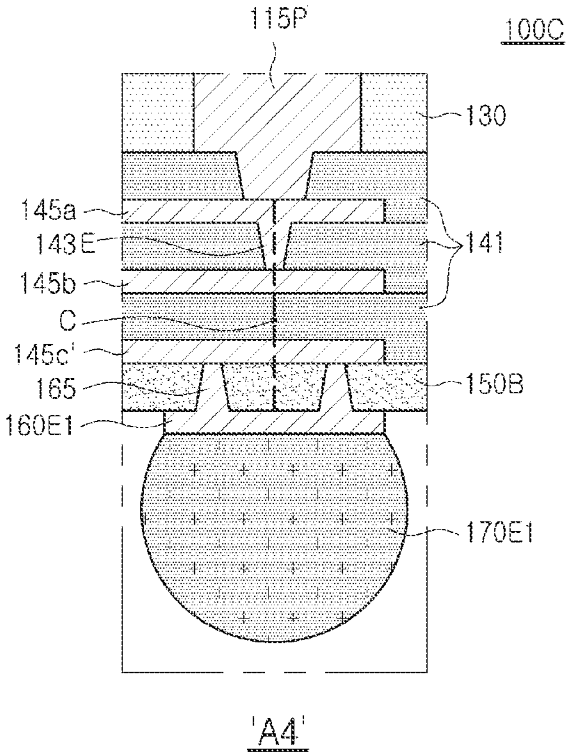
FIG. 16 is a partially enlarged view of portion "A4" of the semiconductor package illustrated in FIG. 15.

Referring to FIG. 16, in semiconductor package 100C, an overlapping UBM layer 160E1 may be disposed to overlap a third redistribution via 143*c*, a lowermost redistribution via, together with a top first redistribution via 143*a*. Both the first and third redistribution vias 143*a* and 143*c*, overlapping the overlapping UBM layer 160E1, may be disposed so as not to overlap four UBM vias 165 and may be disposed in an internal region AZ closer to a central point CP of the overlapping UBM layer 160E1 than the four UBM vias 165. For example, the first and third redistribution vias 143*a* and 143*c* may be arranged on a central axis C passing through the central point CP of the overlapping UBM layer 160E1, and first and second redistribution vias 143*a* may also be arranged to overlap each other.

FIG. 15 is a cross-sectional side view of an example of a semiconductor package, and FIG. 16 is a partially enlarged view of portion "A4" of the semiconductor package illustrated in FIG. 15.

Referring to FIGS. 15 and 16, the semiconductor package 100C may be understood to be similar to the semiconductor package 100 illustrated in FIGS. 1 to 4, except that a conductive post 115P is provided instead of a wiring structure, an upper redistribution layer 185 is provided, and the conductive post 115P is directly connected to a top redistribution layer 145*a*, rather than a top redistribution via 143E. Therefore, the description of the semiconductor package 100 illustrated in FIGS. 1 to 4 may be incorporated in the description of the present example unless explicitly described to the contrary.

Similarly to the semiconductor package 100B illustrated n FIG. 13, the semiconductor package 100C may be manufactured on a wafer level and may include a conductive post 115P such as a copper (Cu) post, instead of a wiring structure of a frame. The conductive posts 115P may connect a lower redistribution layer and an upper redistribution layer to each other. The upper redistribution layer and the upper passivation layer may be formed, similarly to those of the semiconductor package 100B illustrated in FIG. 13.

Unlike the semiconductor package 100B, the semiconductor package 100C may be manufactured by forming a redistribution structure 140' in a build-up manner, and then disposing a semiconductor chip 120 and a conductive post 115P on a first surface of the redistribution structure and forming a molding portion. Accordingly, the semiconductor chip 120 may be provided on a first surface 140A of the redistribution structure 140' to be connected to a connection pad 145P, connected to a redistribution layer 145, using a connection means such as a solder ball.

In the redistribution structure 140' employed in semiconductor package 100C, the redistribution via 143 may be disposed on a lower surface of a corresponding redistribution layer 145 and may have a width narrowed in a direction toward a second surface 140B of the redistribution structure 140'. The lowermost redistribution layer 145*c*' may have a planar structure having no redistribution via.

As described above, the redistribution structure 140' has a structure, different from that of the previously described redistribution structures 140, so that a lower surface of the conductive post 115P may be directly connected to an upper surface of the top redistribution layer 145*a*, rather than the top redistribution via 143E. Even in this case, the above-described stress issue may similarly occur when the top redistribution via 143E overlaps the overlapping UBM layer 160E1. To alleviate the stress issue, the upper redistribution via 143 may be disposed so as not to overlap a plurality of UBM vias 165 and may be disposed on a central axis C passing through central points of the plurality of UBM vias 165.

As described above, when a redistribution via connected to a vertical connection conductor (for example, a wiring structure) inevitably overlaps a portion of UBM layers, the redistribution via may be disposed to overlap a region, closer to a center of a UBM layer than a plurality of UBM vias, for example, a central region of a UMB layer, and thus defects (for example, delamination) caused by stress concentrated on the redistribution via may be significantly reduced.

While example implementations have been shown and described above, it will be apparent to those skilled in the art that modifications and variations could be made without departing from the scope of the present inventive concept as defined by the appended claims.

What is claimed is:

1. A semiconductor package comprising:

a redistribution structure having a first surface and a second surface opposite to the first surface, wherein the redistribution structure comprises a plurality of redistribution layers, the plurality of redistribution layers including a first redistribution layer on a first level adjacent to the first surface, and a second redistribution layer on a second level adjacent to the second surface;

a semiconductor chip disposed on the first surface of the redistribution structure, wherein the semiconductor chip comprises a contact pad connected to the first redistribution layer, and wherein the semiconductor chip is stacked on the first surface of the redistribution structure along a thickness direction of the redistribution structure;

a frame disposed on the first surface of the redistribution structure, having a cavity accommodating the semiconductor chip therein, wherein the frame comprises a wiring structure connected to a first redistribution via of the first redistribution layer;

a molding portion disposed on the first surface of the redistribution structure and encapsulating the semiconductor chip and the frame; and underbump metallization (UBM) layers disposed on the second surface of the redistribution structure, each of the UBM layers having a plurality of UBM vias connected to the second redistribution layer, wherein the UBM layers include at least one UBM layer overlapping, along the thickness direction, the first redistribution via connected to the wiring structure in the thickness direction, and the first redistribution via is disposed so as not to overlap, along the thickness direction, the plurality of UBM vias of the at least one UBM layer and to overlap, along the thickness direction, an internal region closer to a central point of the at least one UBM layer than the plurality of UBM vias.

2. The semiconductor package of claim 1, wherein the at least one UBM layer is disposed to be adjacent to each edge of the second surface of the redistribution structure.

3. The semiconductor package of claim 1, wherein the internal region is a region surrounded at a distance of 25% of a width of the at least one UBM layer from the central point of the at least one UBM layer.

4. The semiconductor package of claim 1, wherein the internal region is a region within 50 μm from the central point of the at least one UBM layer.

5. The semiconductor package of claim 1, wherein the first redistribution via is disposed to overlap, along the thickness direction, the central point of the at least one UBM layer.

6. The semiconductor package of claim 1, wherein the at least one UBM layer includes a plurality of UBM layers disposed to be adjacent to each edge of the second surface of the redistribution structure.

7. The semiconductor package of claim 1, wherein the plurality of UBM vias include two UBM vias, and the first redistribution via is disposed to overlap, along the thickness direction, a region between the two UBM vias.

8. The semiconductor package of claim 1, wherein the plurality of UBM vias includes three or more UBM vias, and the first redistribution via is disposed to overlap, along the thickness direction, a region surrounded by the three or more UBM vias.

9. The semiconductor package of claim 1, wherein the plurality of redistribution layers further include at least one third redistribution layer disposed between the first redistribution layer and the second redistribution layer.

10. The semiconductor package of claim 1, further comprising an additional redistribution structure disposed on the molding portion and including an additional redistribution layer connected to the wiring structure.

11. The semiconductor package of claim 1, wherein the frame includes a first insulating layer and a second insulating layer disposed sequentially on the first surface of the redistribution structure, and the wiring structure includes a first wiring layer buried in a lower surface of the first insulating layer and connected to the first redistribution via, a second wiring layer disposed on an upper surface of the first insulating layer, a third wiring layer disposed on an upper surface of the second insulating layer, a first wiring via penetrating through the first insulating layer and connecting the first and second wiring layers to each other, and a second wiring via penetrating through the second insulating layer and connecting the second and third wiring layers to each other.

12. A semiconductor package comprising:

a redistribution structure having a first surface and a second surface opposite to each other, wherein the redistribution structure comprises a plurality of redistribution layers, respectively having redistribution vias, the plurality of redistribution layers including a first redistribution layer on a first level adjacent to the first surface and a second redistribution layer on a second level adjacent to the second surface;

a semiconductor chip disposed on the first surface of the redistribution structure, wherein the semiconductor chip comprises a contact pad connected to the first redistribution layer, and wherein the semiconductor chip is stacked on the first surface of the redistribution structure along a thickness direction of the redistribution structure;

a vertical connection conductor disposed around the semiconductor chip on the first surface of the redistribution structure, wherein the vertical connection conductor is connected to the first redistribution layer, the first redistribution layer having a first redistribution via overlapping, along the thickness direction, the vertical connection conductor;

a molding portion disposed on the first surface of the redistribution structure, wherein the molding portion encapsulates the semiconductor chip and the vertical connection conductor; and underbump metallization (UBM) layers disposed on the second surface of the redistribution structure, each of the UBM layers having a plurality of UBM vias connected to the second redistribution layer, wherein the UBM layers include at least one UBM layer overlapping the first redistribution via in the thickness direction of the redistribution structure, and the first redistribution via is disposed so as not to overlap, along the thickness direction, the plurality of UBM vias of the at least one UBM layer and to overlap, along the thickness direction, an internal region closer to a central point of the at least one UBM layer than the plurality of UBM vias.

13. The semiconductor package of claim 12, wherein the redistribution vias extend toward the first surface of the redistribution structure on an upper surface of each of the plurality of redistribution layers, and the first redistribution via is connected to a lower surface of the vertical connection conductor.

14. The semiconductor package of claim 12, wherein the redistribution vias extend toward the second surface of the redistribution structure on a lower surface of each of the plurality of redistribution layers, the vertical connection conductor is connected to an upper surface of the first redistribution layer, and the plurality of redistribution layers further include a redistribution pattern disposed between the second redistribution layer and the UBM layer and connected to the plurality of UBM vias.

15. The semiconductor package of claim 12, wherein the internal region is a region surrounded at a distance of 25% of a width of the at least one UBM layer from the central point of the at least one UBM layer.

16. The semiconductor package of claim 12, wherein the plurality of UBM vias include four UBM vias arranged in a square, and the first redistribution via is disposed to overlap, along the thickness direction, a region within 50 μm from the central point of the at least one UBM layer.

17. A semiconductor package comprising:

a redistribution structure having a first surface and a second surface opposite to each other, wherein the redistribution structure comprises a plurality of redistribution layers disposed on different levels and respectively having redistribution vias formed to face the first surface, the plurality of redistribution layers including a first redistribution layer on a first level adjacent to the first surface and a second redistribution layer on a second level adjacent to the second surface;

a semiconductor chip disposed on the first surface of the redistribution structure, wherein the semiconductor chip comprises a contact pad connected to the first redistribution layer, and wherein the semiconductor chip is stacked on the first surface of the redistribution structure along a thickness direction of the redistribution structure;

a vertical connection conductor disposed around the semiconductor chip on the first surface of the redistribution structure, wherein the vertical connection conductor is connected to a first redistribution via of the first redistribution layer;

a molding portion disposed on the first surface of the redistribution structure, wherein the molding portion covers the semiconductor chip and the vertical connection conductor; and underbump metallization (UBM) layers disposed on the second surface of the redistribution structure, each of the UBM layers having a plurality of UBM vias connected to the second redistribution layer, wherein the UBM layers include at least one UBM layer overlapping the first redistribution via in the thickness direction, and the first redistribution via is disposed so as not to overlap, along the thickness direction, the plurality of UBM vias of the at least one UBM layer and to overlap, along the thickness direction, a region within 50 μm from a central point of the at least one UBM layer.

18. The semiconductor package of claim 17, further comprising:

a frame disposed on the first surface of the redistribution structure and having a cavity accommodating the semiconductor chip therein, wherein the vertical connection conductor includes a wiring structure connecting an upper surface and a lower surface of the frame to each other.

19. The semiconductor package of claim 17, wherein the vertical connection conductor includes a conductive post having a lower surface connected to the first redistribution via.

20. The semiconductor package of claim 17, further comprising:

an additional redistribution structure disposed on the molding portion and including an additional redistribution layer connected to the vertical connection conductor.

* * * * *